(12) United States Patent
Zhang et al.

(10) Patent No.: US 8,981,873 B2
(45) Date of Patent: Mar. 17, 2015

(54) ABSORPTIVE TUNABLE BANDSTOP FILTER WITH WIDE TUNING RANGE AND ELECTRICALLY TUNABLE ALL-PASS FILTER USEFUL THEREIN

(75) Inventors: Cemin Zhang, Nashua, NH (US); Michael Koechlin, Chelmsford, MA (US)

(73) Assignee: Hittite Microwave Corporation, Chelmsford, MA (US)

( * ) Notice: Subject to any disclaimer, the term of this patent is extended or adjusted under 35 U.S.C. 154(b) by 644 days.

(21) Appl. No.: 12/932,193

(22) Filed: Feb. 18, 2011

(65) Prior Publication Data

US 2012/0212304 A1 Aug. 23, 2012

(51) Int. Cl.
H03H 7/01 (2006.01)
H03H 7/20 (2006.01)
H03H 7/12 (2006.01)

(52) U.S. Cl.
CPC .............. H03H 7/0153 (2013.01); H03H 7/20 (2013.01); H03H 7/12 (2013.01); H03H 2007/013 (2013.01)
USPC ............................ 333/174; 333/139; 333/176

(58) Field of Classification Search
CPC ......... H03H 7/0115; H03H 7/12; H03H 7/20; H03H 2007/013; H03H 7/0153
USPC ................... 333/168, 171–176, 139
See application file for complete search history.

(56) References Cited

U.S. PATENT DOCUMENTS

| | | | |
|---|---|---|---|
| 3,110,004 A | 11/1963 | Pope | |
| 3,895,304 A | 7/1975 | Klein | |
| 5,019,793 A * | 5/1991 | McNab | 333/156 |
| 5,075,648 A * | 12/1991 | Roberts et al. | 333/128 |
| 5,376,907 A | 12/1994 | Duflot et al. | |
| 7,276,993 B2 * | 10/2007 | York | 333/139 |
| 7,394,333 B2 * | 7/2008 | Ezzeddine et al. | 333/109 |
| 7,498,999 B2 * | 3/2009 | Shtrom | 343/853 |
| 2004/0183624 A1 | 9/2004 | Liang et al. | |
| 2006/0273869 A1 | 12/2006 | Jachowski | |
| 2008/0174384 A1 * | 7/2008 | Petrovic et al. | 333/101 |
| 2009/0289744 A1 | 11/2009 | Miyashiro | |

* cited by examiner

Primary Examiner — Benny Lee
Assistant Examiner — Rakesh Patel
(74) Attorney, Agent, or Firm — Knobbe, Martens, Olson & Bear, LLP (57) ABSTRACT

This invention features an absorptive tunable bandstop filter with a wide tuning range including first and second branches of all-pass filter networks, an input power divider for splitting the input signal and passing approximately half of the input signal power through each branch of the all-pass filter networks, and an output power combiner for recombining the signal power from each branch of the all-pass filter networks, at least one of the branches of the all-pass filter networks being electrically tunable to provide an approximately 180° phase difference with similar amplitudes of the split signal power to be recombined at the output power combiner for rejecting but substantially absorbing selected frequencies.

24 Claims, 14 Drawing Sheets

ABSORPTIVE TUNABLE BANDSTOP FILTER WITH WIDE TUNING RANGE AND ELECTRICALLY TUNABLE ALL-PASS FILTER USEFUL THEREIN

FIELD OF THE INVENTION

This invention relates to an absorptive tunable bandstop filter with wide tuning range and to an electrically tunable all-pass filter useful therein.

BACKGROUND OF THE INVENTION

With the explosive growth of wireless technology, there are many instances where the signal from a nearby wireless transmitter tends to overwhelm an adjacent receiver. Thus, it is ideal to remove the interfering transmitted frequencies by placing a bandstop, or notch, filter at the output of the transmitter to eliminate harmonic and spurious signals due to nonlinearity of active components such as a power amplifier. Bandstop filters can also be placed at the receiver front-ends to remove interferences due to adjacent receive bands and jammers. It is desirable for a bandstop filter to absorb the rejected signals rather than reflect them back to the previous stage, since at low RF power levels, the reflected signals could interact with the transmitted signals to create interferences known as intermodulation distortion products. At high RF power levels, the reflected energy could even physically damage the transmitter. It is also desirable to electronically tune the rejection frequency more than an octave bandwidth, since the strongest harmonics are usually two or three times higher than the transmitted signal frequency. In addition it is a very desirable attribute for the bandstop filter to have the flexibility to tune the rejection bandwidth as well.

There are many YIG based tunable bandstop filters that are commercially available, which can be tuned over a wideband with minimal insertion loss. However, YIG based tunable bandstop filters are bulky and their tuning speed is very slow (compared to electronic tuning). These drawbacks limit the usage of YIG based bandstop filters in current wireless applications where high integration and high speed are demanding. There have been many published methods in achieving planar bandstop filters but none have reported the ability to deliver an absorptive bandstop filter that can be electronically tuned over an octave bandwidth or greater, and none have the capability to tune both the rejection frequency and the rejection bandwidth.

For example, U.S. Pat. No. 3,895,304, entitled "Tunable Microwave Notch Filter", Klein, Jul. 15, 1975, discloses quadrature hybrid devices to steer transmitted and reflected energy to provide an absorptive bandstop filter. This approach, however, uses a phase shifter, and therefore is inherently narrow band. Also, it does not provide the bandwidth tuning ability.

U.S. Patent Publication No. US20040183624A1, Electrically Tunable Notch Filters, Liang et al, Sep. 23, 2004, discloses a bandstop filter including a main transmission line and at least one electrically tunable resonator coupled to the transmission line. However, this device requires a large number of resonators to provide a reasonable level of rejection or wider stop band resulting in higher insertion loss over the passband. Also a length of ¼ wavelength is required between each two resonators leading to a relatively narrow frequency tuning solution that is physically large.

U.S. Patent Publication No. US20060273869A1, Narrowband Absorptive Bandstop Filter with Multiple Signal Paths, Jachowski, Dec. 7, 2006, discloses bandstop filtering using directional couplers to steer signals as well as band pass filters to add and subtract signals to create the notch characteristic. While this approach provides a good absorptive characteristic, it uses a microstrip delay line phase shifter which is narrow band in nature. Also, the rejection bandwidth tuning option is not available.

U.S. Patent Publication No. US20090289744A1, Electronically Tunable, Absorptive, Low-loss Notch Filter, Miyashiro, Nov. 26, 2009, discloses a tunable absorptive bandstop filter using a four port quadrature hybrid coupler connected to a matched pair of band pass resonators and resistive terminations. While it shows low loss and high power handling capacity, the level of isolation between the first and fourth terminals became a limiting factor to the rejection level of the bandstop filter. Also relying on the quadrature hybrid coupler made it relatively large size and limited bandwidth.

SUMMARY OF THE INVENTION

It is therefore an object of this invention to provide an improved, versatile, absorptive tunable bandstop filter with an extremely wide tuning range and a tunable all-pass filter used therein.

It is a further object of this invention to provide such an improved, versatile, absorptive tunable bandstop filter with an extremely wide tuning range and a tunable all-pass filter used therein in which the stop band frequency can be tuned over more than 3.5:1 tuning ratio. 3.5:1 tuning ratio.

It is a further object of this invention to provide such an improved, versatile, absorptive tunable bandstop filter with broadband match, non-reflective, characteristics in the stop band.

It is a further object of this invention to provide such an improved, versatile, absorptive tunable bandstop filter in which the tuning range is set by the difference between center frequencies of all-pass filters and is not limited by the capacitance tuning ratio.

It is a further object of this invention to provide such an improved, versatile, absorptive tunable bandstop filter in which the tuning range may be further increased with addition of all-pass filter sections.

It is a further object of this invention to provide such an improved, versatile, absorptive tunable bandstop filter in which the filter may be implemented on a planar monolithic substrate and the substrate may be mounted on a surface mount package.

The invention results from the realization that a truly improved absorptive bandstop filter with wide tuning range can be achieved with a pair of power dividers joined by two branches of all-pass filter networks. Signals are split by the first power divider which also improves the power handling capability. Half the power passes through the upper branch all-pass network(s) and the other half passes through the lower branch all-pass networks. Both signals are recombined at the second power divider. Tuning of the bandstop frequency is achieved by electrically controlling the upper or lower all-pass filter branches, to provide 180° of phase difference with similar amplitude when signals join at the second power divider thereby providing a rejection center frequency tuning ratio of more than 3.5:1, with the flexibility to control the rejection bandwidth as well and having relatively low insertion loss, high power handling, and being readily implementable as a monolithic microwave integrated circuit (MMIC).

This invention features an absorptive tunable bandstop filter with wide tuning range including first and second branches of all-pass filter networks, an input power divider for splitting the input signal and passing approximately half of the input signal power through each the branch of the all-pass filter networks, and an output power divider for recombining the signal power from each the branch of the all-pass filter networks, at least one of the branches of the all-pass filter networks being electrically tunable to provide an approximately 180° phase difference with similar amplitudes of said split signal power to be recombined at the output power divider for rejecting but substantially absorbing selected frequencies.

In one embodiment, the absorptive tunable bandstop filter may include at least first and second all-pass filters and the second branch includes at least a third all-pass filter. The first and second all-pass filters may have a relatively lower center frequency and the other a higher center frequency and the third all-pass filter may have a center frequency corresponding to the higher center frequency. Each of the branches of all-pass filter networks may include a plurality of all-pass filters. The electrically tunable all-pass filter networks may be voltage tunable. The power divider may include a 3 dB coupling device. The 3 dB coupling device may include a Wilkinson divider. The 3 dB coupling device may include a quadrature hybrid. The 3 dB coupling device may include a 180° hybrid. The 3 dB coupling device may include a Lange coupler. The 3 dB coupling device may include a directional coupler. The all-pass filter may include first and second series connected inductors connected in parallel with first and second series connected electrically tunable variable capacitors; a shunt electrically tunable variable capacitor may be connected to the junction of the first and second inductors, and a shunt bias network may be connected to the junction of the first and second variable capacitors. The absorptive tunable bandstop filter may include an input bias network which connects an electrical tuning voltage to the variable capacitors. The shunt bias network and input bias network may be similar. The shunt bias network and input bias network each may include a series connected bias resistance and bias inductor. The shunt bias network and the shunt variable capacitor may be connected to ground. Each of the electrically tunable variable capacitors may include a varactor. Each of the varactors may include a diode. At least one of the varactors may include two diodes with like electrodes coupled together. Each of the varactors may include a pn junction. Each of the varactors may include a field effect transistor. The electrically tunable variable capacitor may include a ferroelectric capacitor. The electrically tunable variable capacitor may include a MEMS based capacitor. The all-pass filter networks may be implemented on a planar monolithic substrate. The planar monolithic substrate may be selected from the group of GaAs and SiGe. The planar monolithic substrate may be mounted on a surface-mount package.

The subject invention, however, in other embodiments, need not achieve all these objectives and the claims hereof should not be limited to structures or methods capable of achieving these objectives.

BRIEF DESCRIPTION OF THE SEVERAL VIEWS OF THE DRAWINGS

Other objects, features and advantages will occur to those skilled in the art from the following description of a preferred embodiment and the accompanying drawings, in which:

FIG. 18 shows the generalized topology of the tunable bandstop filter of this invention; and.

DETAILED DESCRIPTION OF THE INVENTION

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

Figure 1:
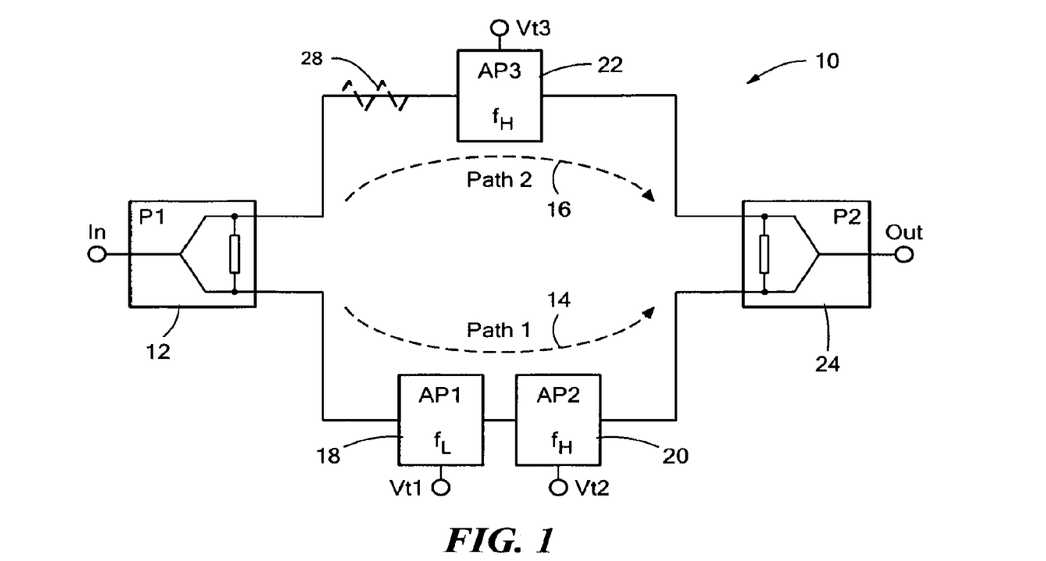
FIG. 1 is a schematic block diagram of one embodiment of an absorptive tunable bandstop filter with wide tuning range according to this invention.

There is shown in FIG. 1 a preferred embodiment of a tunable bandstop filter 10 in accordance with the present invention. It includes a first input 3 dB power divider P1 12 and lower path 1 14 and upper path 2 16 branches of all-pass filter networks AP1 18, AP2 20, AP3 22 and a second output 3 dB power divider P2 24. The preferred 3 dB power dividers P1 12 and P2 24 may be further specified as three stage Wilkinson power dividers to ensure wideband performance. More stages may be added if a wider operation band is desired. The input signal at input terminal 26 is split roughly in half by power divider P1 12 into signals of approximately equal amplitude and phase. The signal then goes through all-pass filters AP1 18, and AP2 20 along path 1 14 and through all-pass filter AP3 22 along path 2 16. All-pass filters AP2 20 and AP3 22 are designed to have the same frequency-phase response and reside at a higher center frequency, $f_H$, than the center frequency, $f_L$, of all-pass filter AP1 18. It is the frequency difference between $f_H$ and $f_L$ that determines the tuning range of the bandstop filter. Theoretically, $f_H$ can be many times higher than $f_L$. Thus the bandstop filter can achieve extremely wide tuning range. Voltages $V_t1$, $V_t2$, and $V_t3$ are the tuning voltages to control the phase response of all-pass filters AP1 18, AP2 20, and AP3 22, respectively, in order to provide the approximately 180° phase difference with similar amplitude between path 1 14 and path 2 16 for the frequencies that are desired to be rejected. The bandstop response is created when the signals from the upper and lower branches or paths combine and are absorbed by the output power divider P2 24.

Tunable bandstop filter 10 provides four operation modes by simply setting the tuning voltages $V_t1$, and $V_t2$ as listed in table 1 below where $V_t3$ is tied to a low potential such as ground.

TABLE 1

Four operation modes and their control conditions

| mode | Vt1 | Vt2 | Vt3 | Description |
|---|---|---|---|---|
| I | tuned* | tuned, = Vt1 | 0 V | Full band frequency tuning |
| II | tuned | 0 V | 0 V | Low band frequency tuning, with narrower rejection bandwidth |
| III | +13 V | tuned | 0 V | High band frequency tuning, with narrower rejection bandwidth |
| IV | 0 V | tuned | 0 V | Rejection bandwidth tuning |

*"tuned" means adjusting the tuning voltage from 0 V to +13 V.

By joining a pair of power dividers such as Wilkinson power dividers by two branches of all-pass filter networks as has been done in FIG. 1 and properly controlling the all-pass networks, the stop band frequency can be tuned over an extremely wide bandwidth, e.g. more than 3.5:1 tuning ratio. The achieved wider tuning range compared to the prior art is due to the use of all-pass networks in both branches or paths where the tuning range is not limited by the tuning capacitance ratio. The tuning range of the inventive approach of this invention is extended as a function of $f_H/f_L$ of the all-pass networks, and $f_H/f_L$ can be increased by adding more filter sections. This inventive approach also has the flexibility to operate under different modes to tune the rejection bandwidth. As shown in the preferred embodiment of FIG. 1 one branch or path has one all-pass filter section AP3 22 and the other branch or path has all-pass filter sections AP1 18 and AP2 20. They can provide 180° of phase difference with similar amplitude when the signals are joined at the second power divider P2 24. A small loss resistance may be inserted into the branch with fewer all-pass sections to improve the amplitude balance as indicated by the phantom resistance 28 shown in upper branch or path 2 16 of tunable bandstop filter 10.

This inventive approach also has a benefit of broad band match, that is, non-reflective characteristics in the stop band compared with certain prior art approaches. The values of the fixed inductors and variable capacitors of the all-pass filters are selected so that the all-pass filters AP2 20 and AP3 22 have the phase frequency response centered at $f_H$ while all-pass filter AP1 18 is centered at $f_L$. The difference between the $f_H$ and $f_L$ frequencies sets the tuning range of the bandstop filter. Whereas in certain prior art approaches the tuning range is limited by the capacitance tuning ratio. The inventive approach can be generalized by increasing the number of all-pass sections along the two branches. The tuning range could be further increased with added sections and amplifiers could be added to compensate for losses. The power splitting device may be a three dB coupling device and may take the form as indicated of a Wilkinson divider, or a quadrature hybrid, a 180° hybrid, a Lange coupler, a directional coupler, etc. or any other suitable device.

Figure 2:
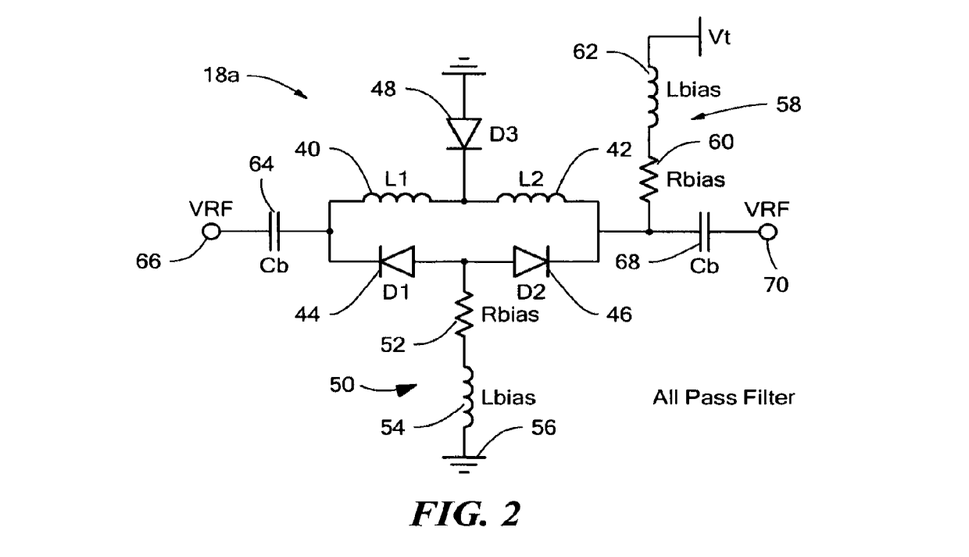
FIG. 2 is a schematic block diagram of one embodiment of an electrically tunable all-pass filter of this invention useable in the absorptive tunable bandstop filter of FIG. 1.

One embodiment of an all-pass filter 18a, FIG. 2, according to this invention includes two fixed inductors L1 40 and L2 42 in parallel with two variable capacitors e.g. varactor diodes with a tuning capacitance ratio of 4:1 D1 44 and D2 46. A shunt variable capacitor D3 48 is inserted between the junction of inductor L1 40 and inductor L2 42. Varactor diodes D1 44 and D2 46 are identical in size and roughly half of the size of varactor diode D3 48. A shunt bias network comprised of resistance $R_{bias}$ 52 and inductor $L_{bias}$ 54 in series with RF choke $L_{bias}$ 54 is connected between the anodes of diodes D1 44 and D2 46 and ground 56 to provide a DC return path for the diodes. Control voltage Vt is fed through a bias network 58, having the same topology as shunt bias network 50, to the cathodes of diodes D1 44, D2 46 and D3 48. Resistance $R_{bias}$ 60 is similar to resistance $R_{bias}$ 52 and inductor $L_{bias}$ 62 is similar to inductor $L_{bias}$ 54. A fixed capacitor Cb 64 is set at the input 66 and a similar capacitor 68 is set at the output 70 for the purpose of DC blocking. For this implementation the values of the varactor diodes D1 44, D2 46, D3 48 and the inductors L1 40, L2 42 are set at a higher frequency $f_H$ while the values of varactor diode and inductors for all-pass filters AP1 are set at a lower frequency $f_L$. In one implementation diodes D1 44, D2 46, and D3 48 may be implemented with varactor diodes having tuning ratio of 4:1. Input and output DC blocking capacitors $C_b$ 64 and 68 may have the value of 18 pF, $R_{bias}$ resistors 52 and 60 may have a value of 1000 Ohm and $L_{bias}$ inductors 54 and 62 may have a value of 4 nH providing an $f_H$ equal to approximately 10 GHz and an $f_L$ equal to approximately 5 GHz.

The electrically tunable capacitors may each include a varactor as indicated. Each varactor may include one diode or it may include two diodes coupled together in an anode to anode or cathode to cathode configuration in a conventional way. Each of the varactors may include a pn junction. Each of the varactors may include a field effect transistor (FET) and use the capacitance between the gate and source of the FET. Each electrically tunable capacitor may include a ferroelectric base capacitor each electrically tunable tunable capacitor may include a MEMs based capacitor.

Figure 3:
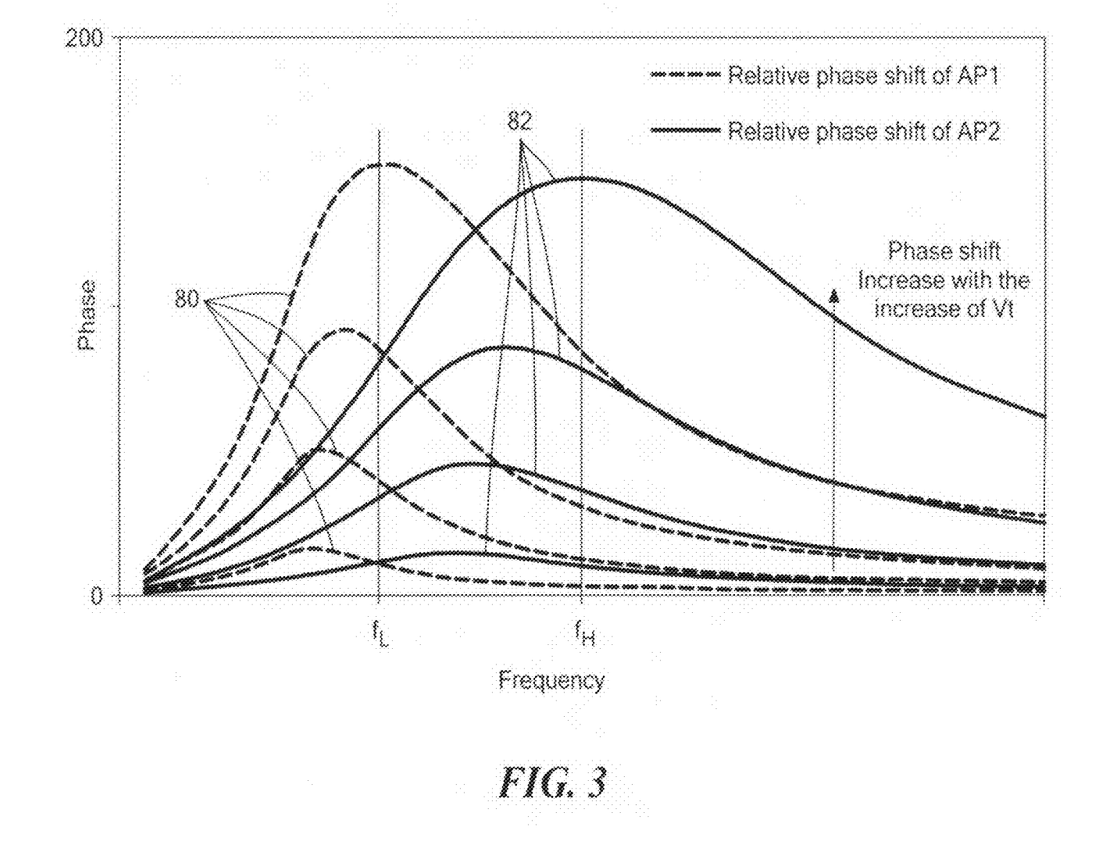
FIG. 3 illustrates the relative phase response of all-pass sections AP1 and AP2 in FIG. 1.

The relative phase response of all-pass filters AP1 18 and AP2 20 is shown in FIG. 3. As can be seen the phase increases with the increase of the tuning voltage Vt for all-pass filter AP1 80 and all-pass filter AP2 82. All-pass filter AP1 18 is designed to operate at a lower frequency $f_L$, and all-pass filter AP2 20 as well as all-pass filter AP3 22 is designed to operate at a higher frequency $f_H$. The ratio of $f_H/f_L$ determines the bandstop tuning range which is not limited by the tuning capacitor ratio as with certain prior art approaches.

Figure 4:
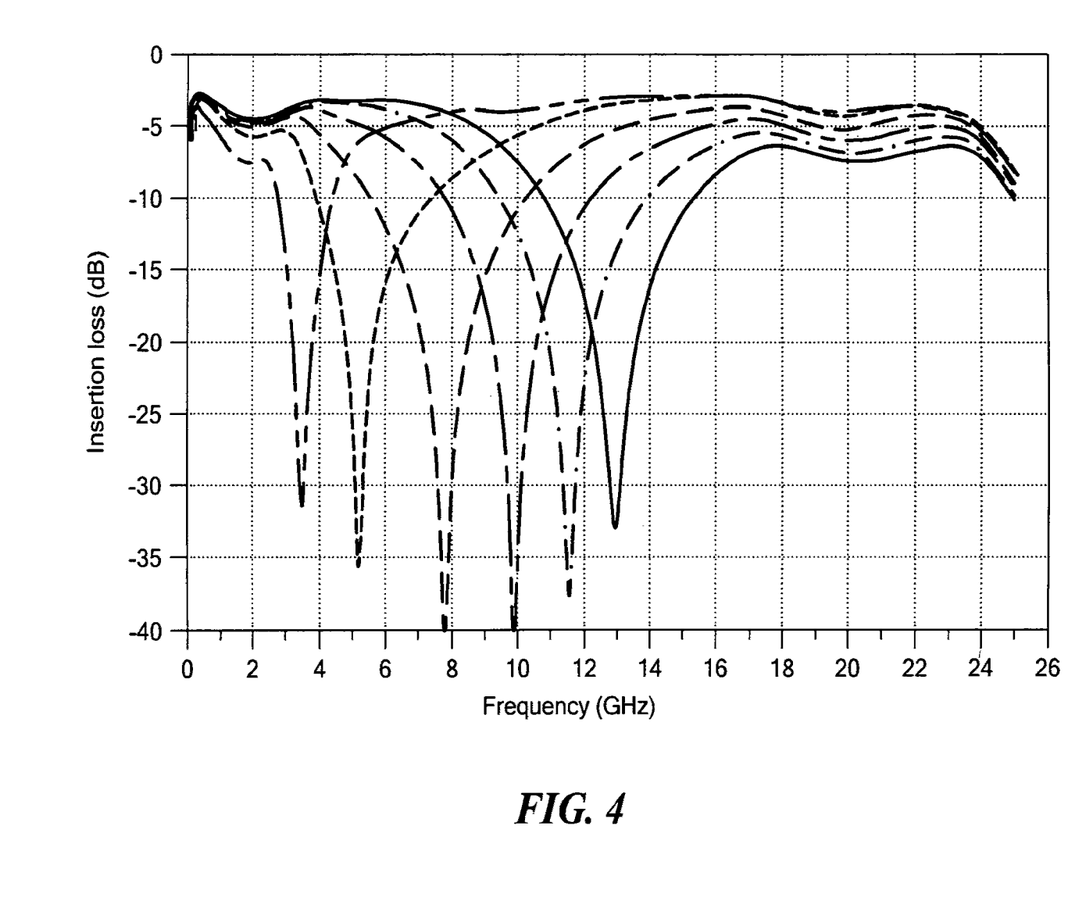
FIG. 4 shows the insertion loss of the novel tunable bandstop filter of FIG. 1 operating under mode I.
Figure 5:
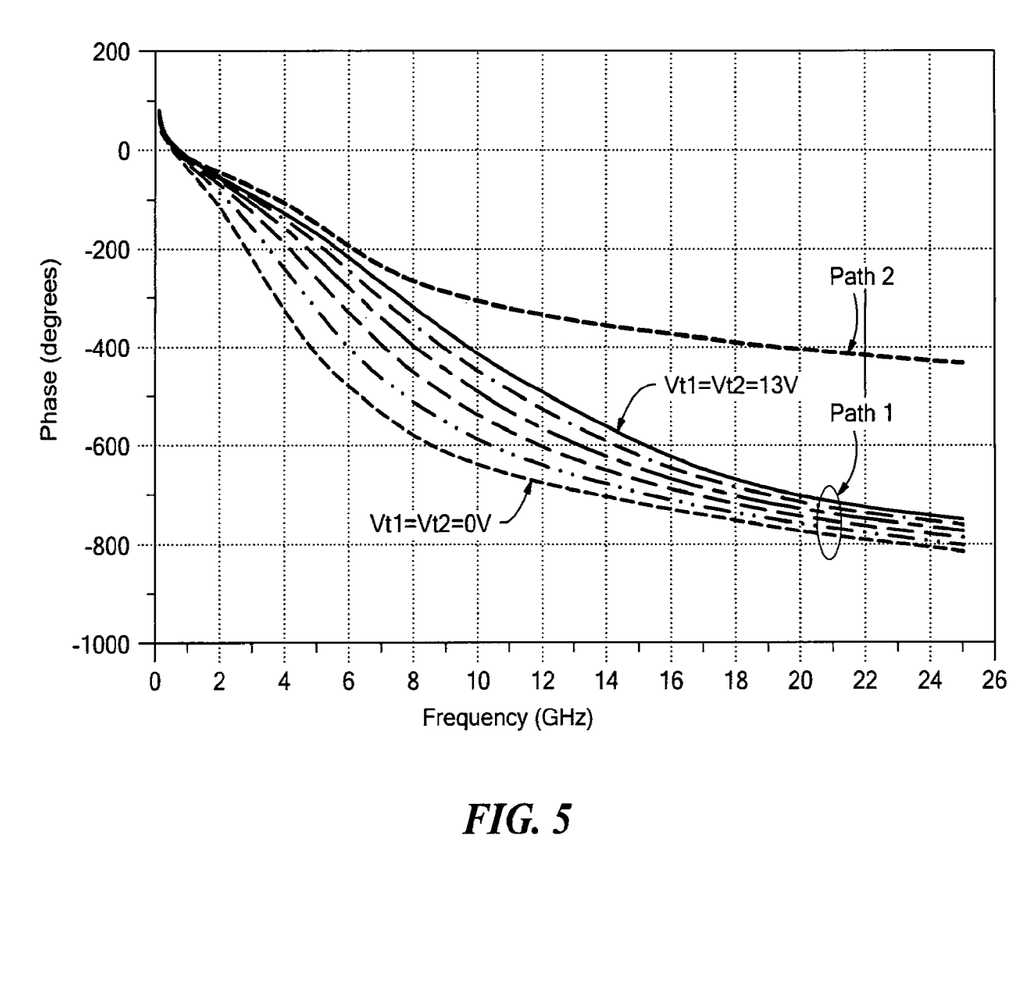
FIG. 5 shows the phase-frequency characteristics of path 1 and path 2 of the tunable bandstop filter of FIG. 1 under mode I.
Figure 6:
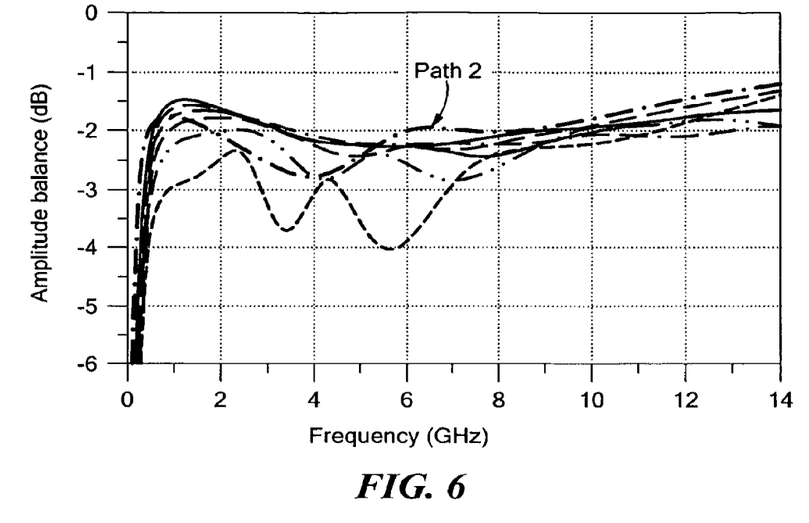
FIG. 6 shows the amplitude balance between signal path 1 and path 2 of the tunable bandstop filter of FIG. 1 under mode I.
Figure 7:
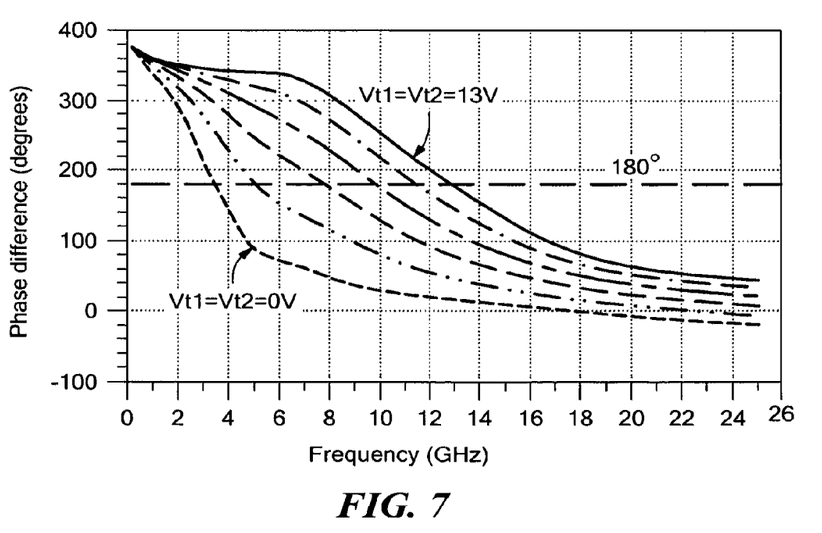
FIG. 7 shows the phase difference between path 1 and path 2 of the tunable bandstop filter of FIG. 1 under mode I.
Figure 8:
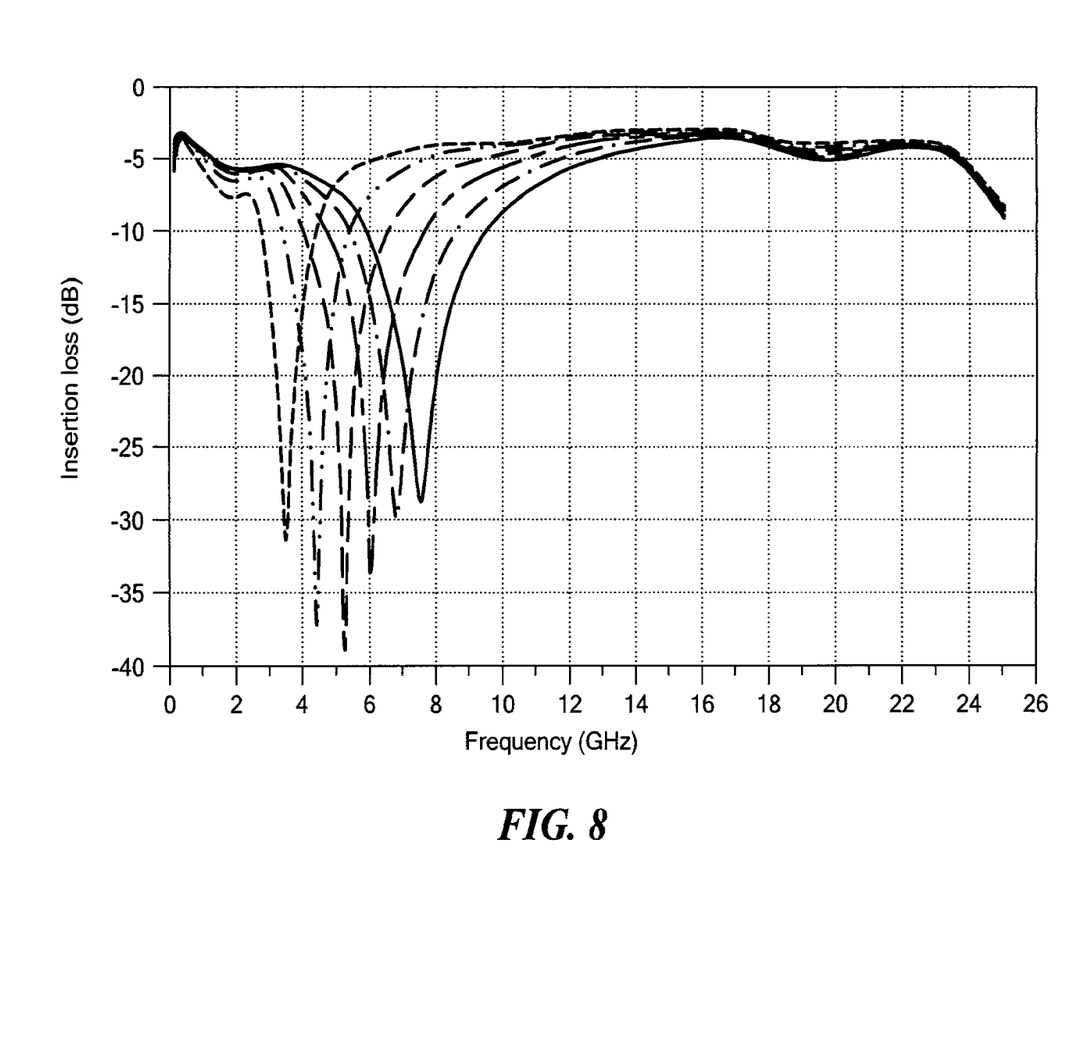
FIG. 8 shows the insertion loss of the tunable bandstop filter of FIG. 1 operating under mode II.
Figure 9:
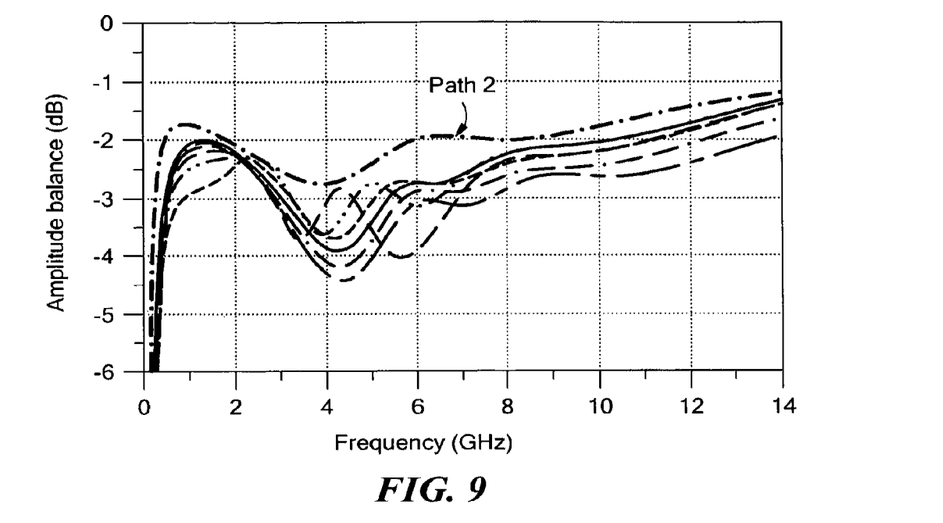
FIG. 9 shows the amplitude balance between signal path 1 and path 2 under mode II of the tunable bandstop filter of FIG. 1.
Figure 10:
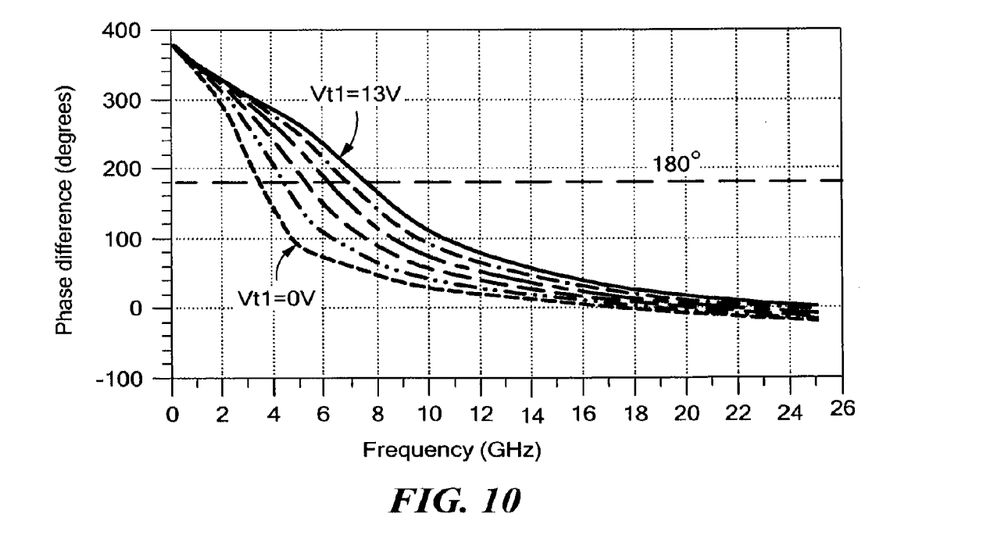
FIG. 10 shows the phase difference between path 1 and path 2 of the tunable bandstop filter of FIG. 1.
Figure 11:
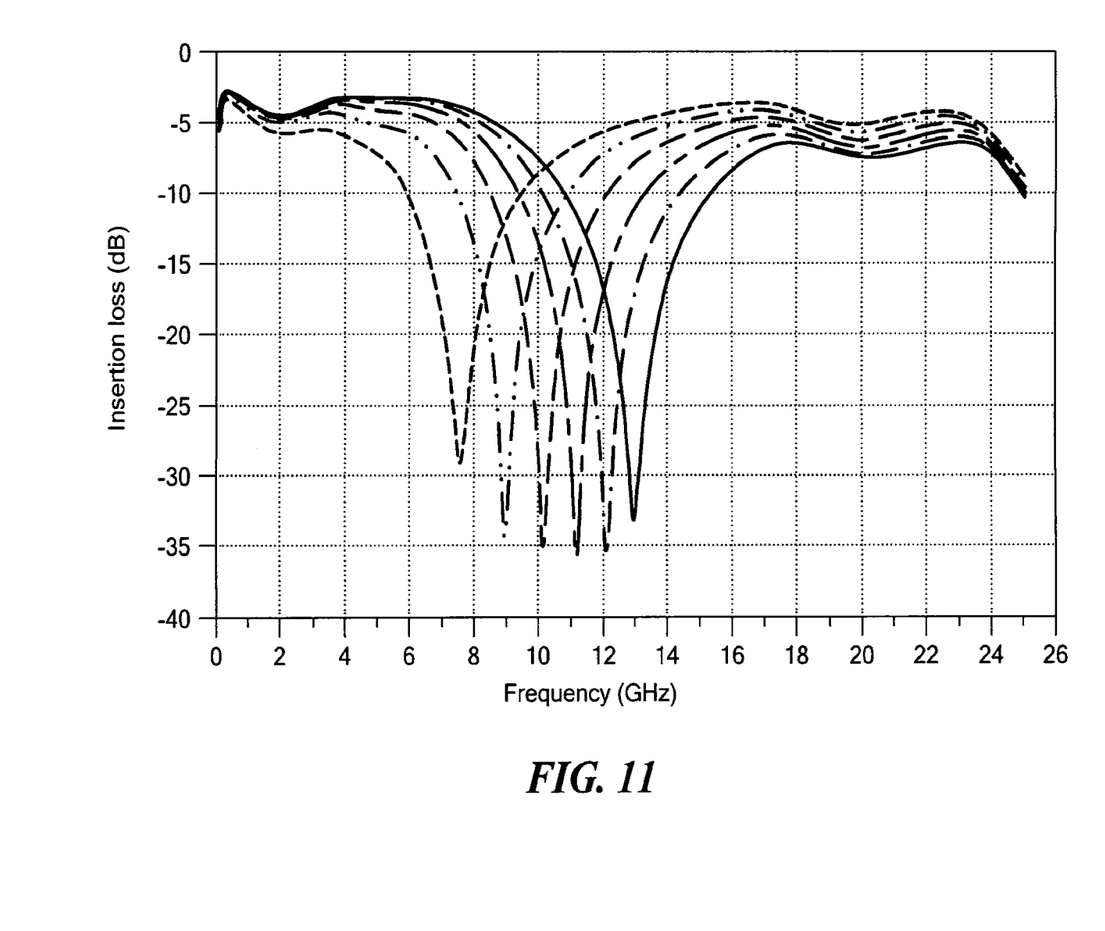
FIG. 11 shows the insertion loss of the tunable bandstop filter of FIG. 1 operating under mode III.
Figure 12:
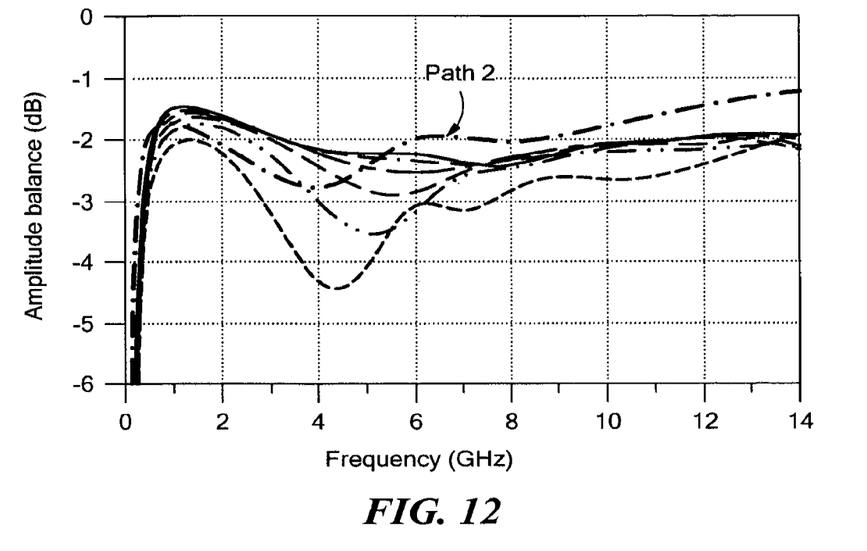
FIG. 12 shows the amplitude balance between signal path 1 and path 2 under mode III of the tunable bandstop filter of FIG. 1.
Figure 13:
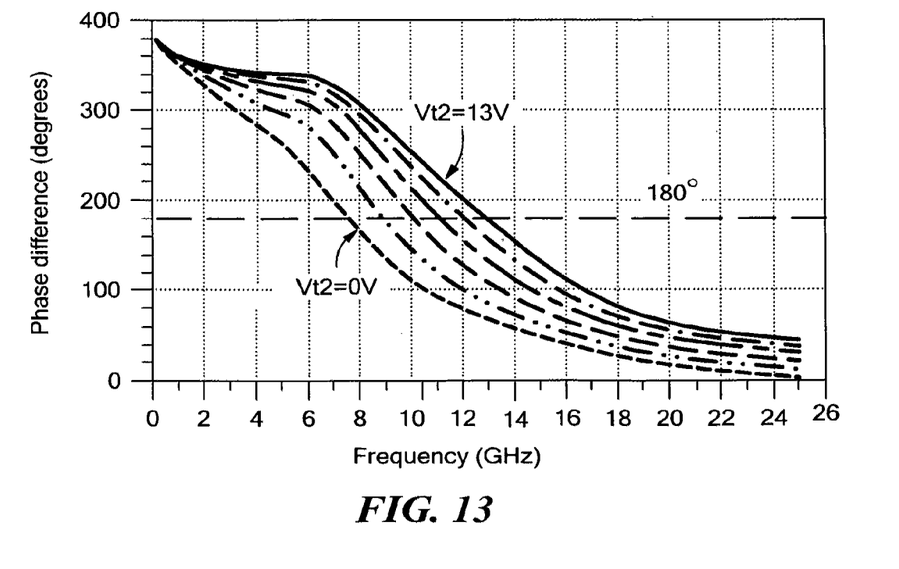
FIG. 13 shows the phase difference between path 1 and path 2 of the tunable bandstop filter of FIG. 1.
Figure 14:
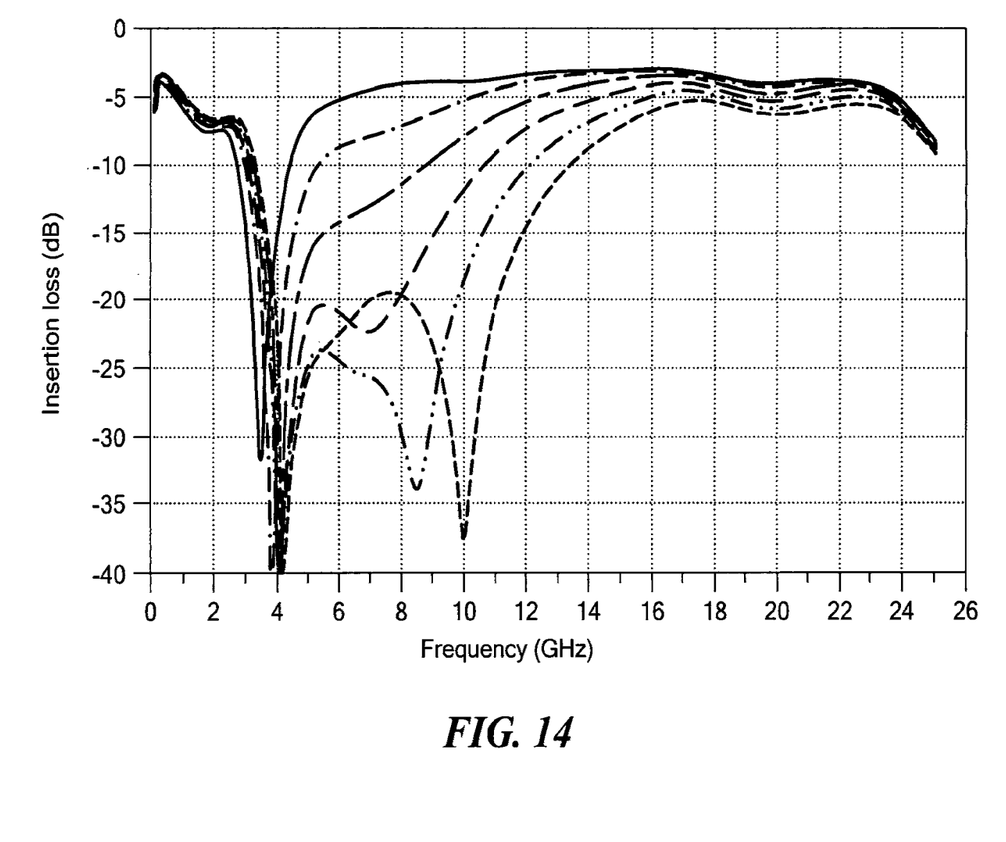
FIG. 14 shows the insertion loss of the tunable bandstop filter of FIG. 1 operating under mode IV of the tunable bandstop filter of FIG. 1.
Figure 15:
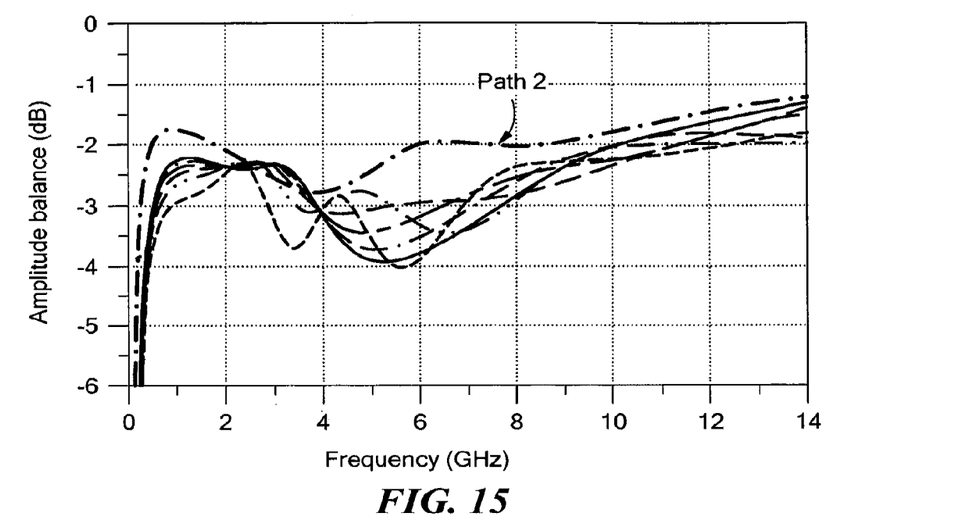
FIG. 15 shows the amplitude balance between signal path 1 and path 2 under mode IV of the tunable bandstop filter of FIG. 1.
Figure 16:
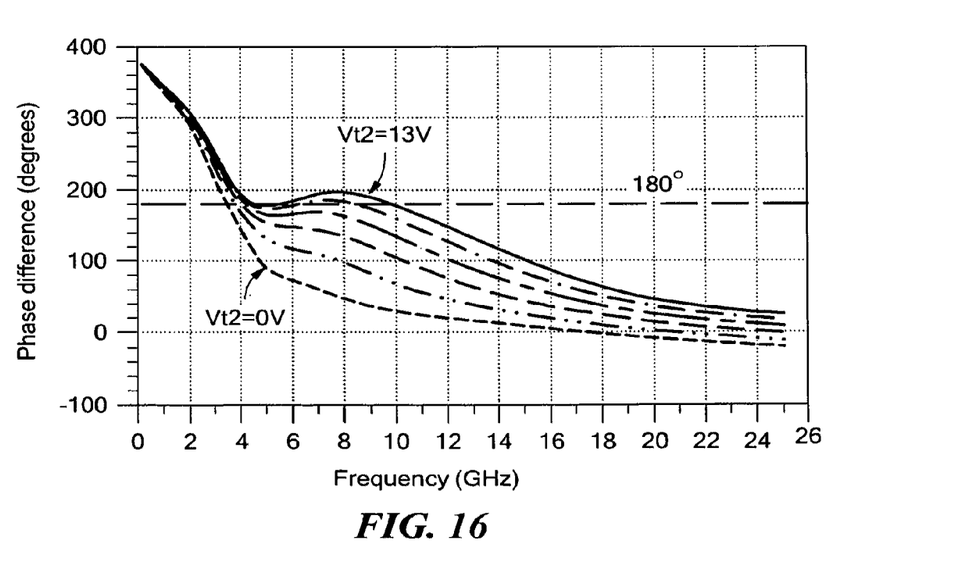
FIG. 16 shows the phase difference between path 1 and path 2 of the tunable bandstop filter of FIG. 1.

The insertion loss of the tunable bandstop filter of FIG. 1 operating under mode I is shown in FIG. 4. There it can be seen that the stop band can be continuously tuned from 3.5 GHz to 13 GHz, a 3.7:1 tuning ratio, when Vt 1 and Vt 2 are tuned together and the rejection level is better than minus 30 dB across the tuning range. The phase frequency characteristics of path 1 and path 2 of the tunable bandstop filter of FIG. 1 are shown in FIG. 5 where the voltage before the condition in which the voltages Vt 1 equals Vt 2 varies from zero volts to 13 volts. The amplitude balance between signal path 1 and signal path 2 of the tunable bandstop filter of FIG. 1 operating under mode 1 is shown in FIG. 6. There the loss of path 1 is slightly higher than the loss of path 2 since two all-pass filters are connected in series in path 1. A loss resistance can be inserted in path 2 to achieve a better amplitude balance and a deeper rejection level which is a trade off with the insertion loss over the pass band. FIG. 7 shows the phase difference between path 1 and path 2 in the tunable bandstop filter of FIG. 1. The frequencies at which the phase difference crosses the 180° line of FIG. 7 are where the signals cancel and the rejection band is formed. FIG. 8 shows the insertion loss of the tunable bandstop filter of FIG. 1 operating under mode II. Compared to mode I operation mode II provides narrower rejection bandwidth and better pass band insertion loss with a tuning range of from 3.5 GHz to 7.5 GHz. Under this mode, only Vt 1 is tuned and both Vt 2 and Vt 3 are connected to low voltage potential such as ground. FIG. 9 shows the amplitude balance between signal paths 1 and 2 under mode II of the tunable bandstop filter of FIG. 1. FIG. 10 shows the phase difference between path 1 and path 2. FIG. 11 shows the insertion loss of the tunable bandstop filter of FIG. 1 operating under mode III. Compared to mode I, operation mode III provides narrower rejection bandwidth and better pass band insertion loss, with a tuning range from 7.5 GHz to 13 GHz. Under this mode only Vt 2 is tuned; Vt 1 is tied to high voltage potential (plus 13 V) and Vt 3 is connected to low potential (0 V). FIG. 12 shows the amplitude balance between signal paths 1 and 2 under mode III of the tunable bandstop filter of FIG. 1, while FIG. 13 shows the phase difference between those paths. FIG. 14 shows the insertion loss of the tunable bandstop filter of FIG. 1 operating under mode IV. In this mode only Vt 2 is tuned; both Vt 1 and Vt 3 are connected to low voltage potentials such as ground. The bandwidth of the −20 dB rejection band, for example, is continuously tunable from 0.5 GHz to 7.5 GHz. The amplitude balance between paths 1 and 2 under mode IV of the tunable bandstop filter of FIG. 1 is shown in FIG. 15, while FIG. 16 shows the phase difference between paths 1 and 2. Here the wider range of rejection bandwidth comes from the wider portion of the phase difference close to 180° when Vt 2 is increased.

Figure 17:
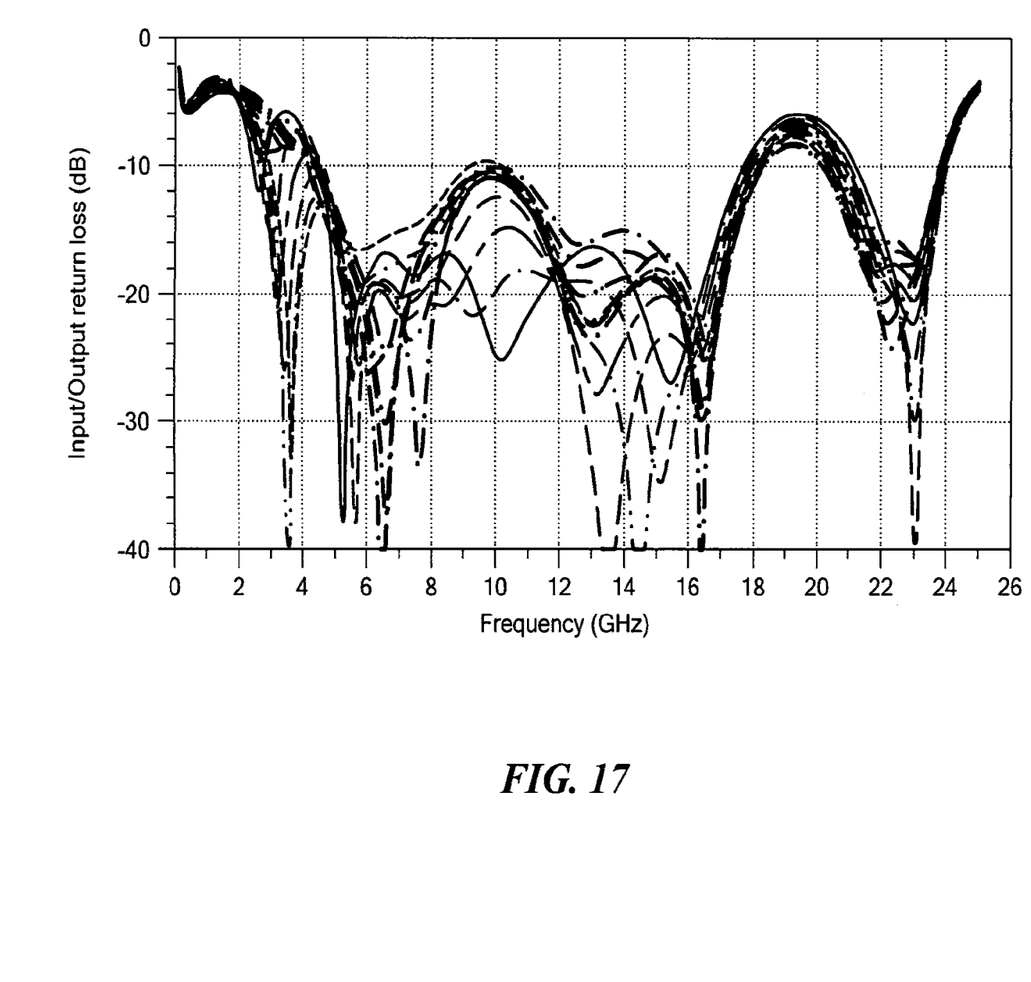
FIG. 17 shows the typical return loss at input and output ports of the tunable bandstop filter of FIG. 1 at various control voltages.

The typical return loss at input and output ports of the tunable bandstop filter of FIG. 1 at various control voltage is shown in FIG. 17. The return loss is better than −10 dB across the rejection band, a good illustration of its absorptive nature. The useful bandwidth of the bandstop filter is determined by the bandwidth of the Wilkinson power divider which can be further extended by increasing the number of the divider stages at the expense of larger size and higher insertion loss.

Figure 18:
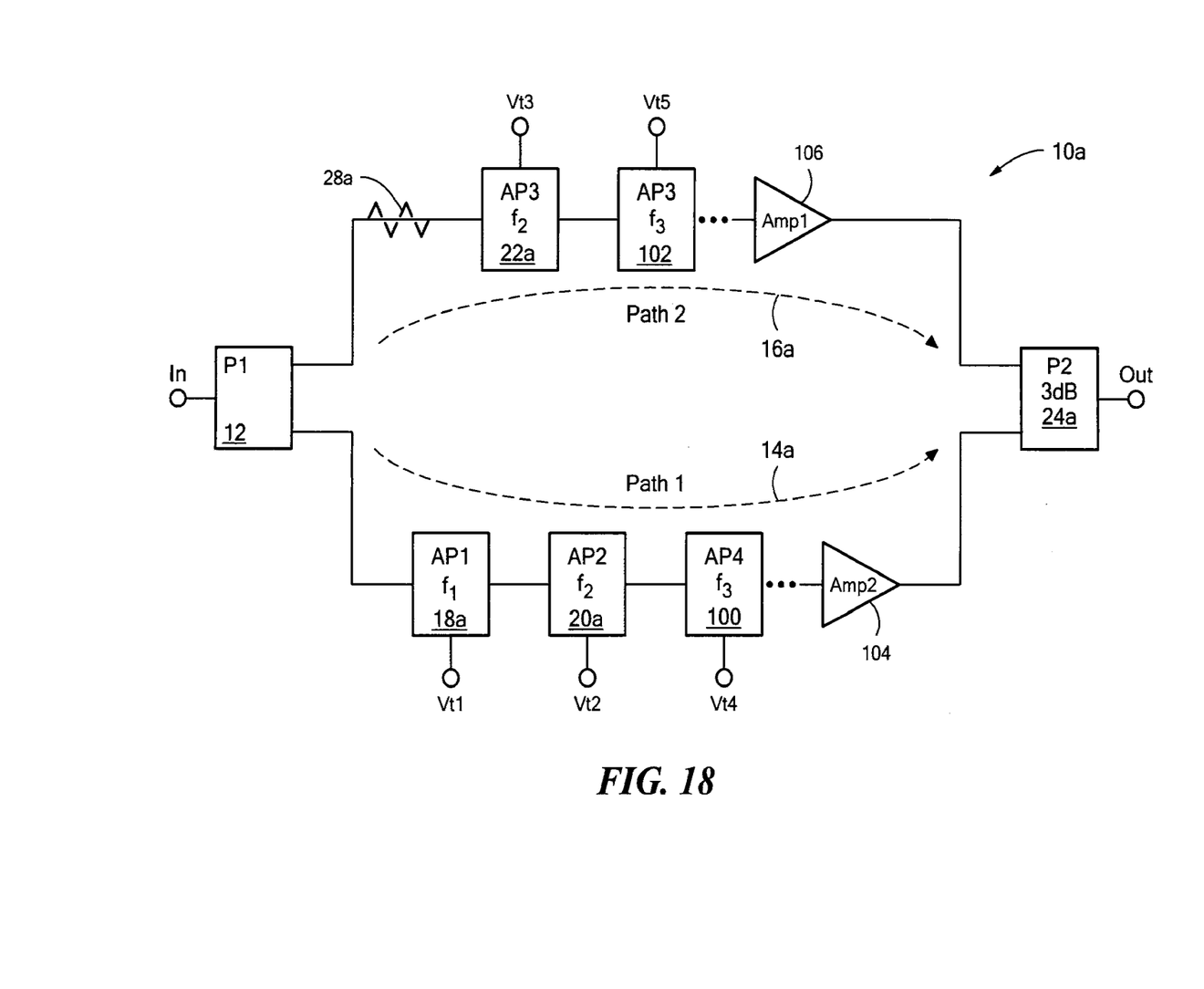

A more generalized embodiment of the tunable bandstop filter of this invention, FIG. 18, uses three dB power dividers, P1 12a and P2 24a, which can include a wide variety of circuits such as a Wilkinson power divider, Lange coupler, quadrature hybrid, 180° hybrid, etc. The number of all-pass filter sections 18a, 20a, 22a may be increased e.g. all-pass filters 100 and 102 and optimized based on the bandstop range requirement. For example, by putting extra all-pass filter sections centered at $f_1$, $f_2$, and $f_3$ (with $f_1$ less than $f_2$ less than $f_3$) along path 1 and path 2, as shown in FIG. 18, the tuning range can be further extended. Also amplifiers 104, 106 may be added to path 1 and path 2 to compensate for losses and the balancing resistor 28a once again may be used.

Figure 19:
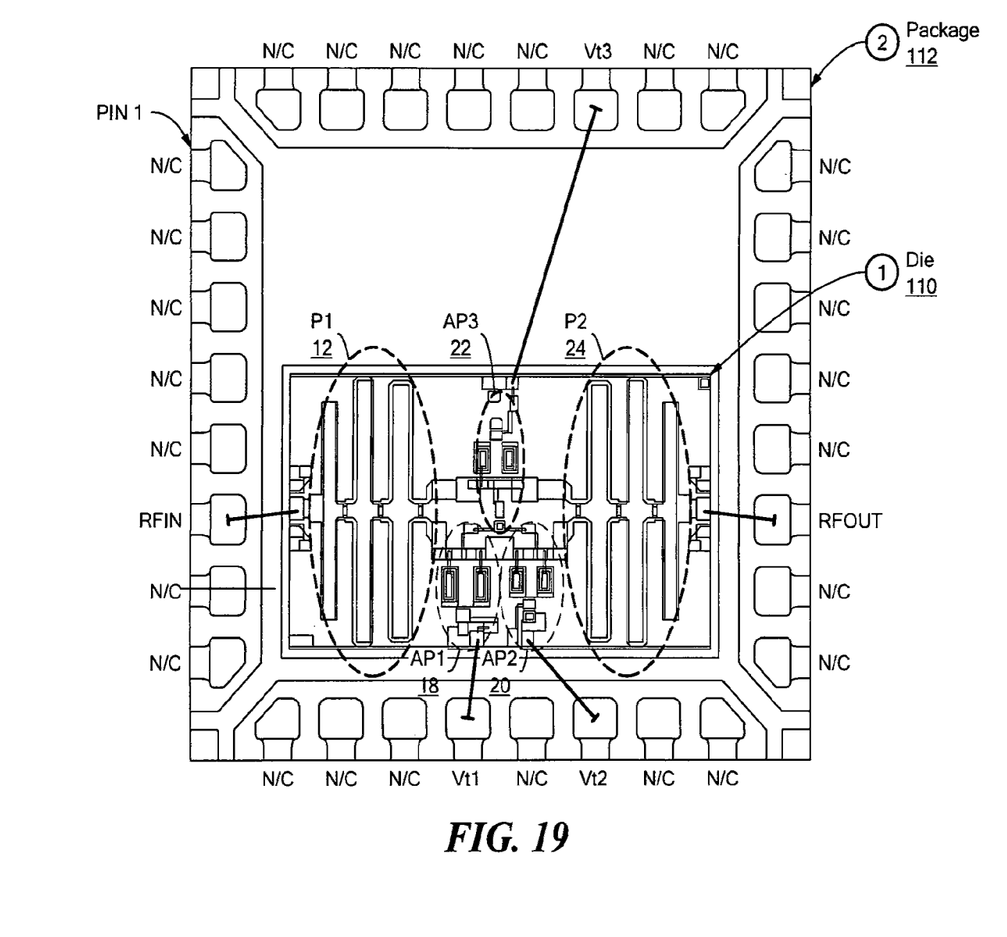
FIG. 19 shows the layout of the MIMIC die for the tunable bandstop filter and electrically tunable all-pass filters of this invention and the bonding diagram showing how the MMIC die is assembled into a surface mount package.

The implementation according to this invention of the layout of the tunable bandstop filter and electrically tunable all-pass filters of this invention may be implemented in MMIC die 110, FIG. 19, which is a bonding diagram showing how the MMIC die 110 is assembled onto a surface mount package 112.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. An absorptive tunable bandstop filter with a wide tuning range comprising:
   first and second branches of voltage-tunable all-pass filter networks configured such that the first branch includes at least a first all-pass filter having a first voltage tuning port and a second all-pass filter having a second voltage tuning port, and the second branch includes at least a third all-pass filter having a third voltage tuning port, the third tuning port of the third all-pass filter tied to a first fixed voltage to provide a first phase in said second branch and wherein said first phase is defined as a 0° reference phase relative to a phase of the first branch and
   one of the first all-pass filter and the second all-pass filter having a lower center frequency and the other having a higher center frequency and said third all-pass filter having a center frequency corresponding to said higher center frequency;
   an input power divider for splitting an input signal power and passing approximately half of the input signal power through each of said first and second branches of said all-pass filter networks; and
   an output power combiner for recombining the signal power from each of said first and second branches of said all-pass filter networks;
   the first branch of said all-pass filter networks being electrically tunable to provide an approximately 180° phase difference of said split signal power to be recombined at said output power combiner for rejecting but substantially absorbing selected frequencies.

2. The absorptive tunable bandstop filter of claim 1, in which said all-pass filter networks are implemented on a planar monolithic substrate.

3. The absorptive tunable bandstop filter of claim 2, in which said planar monolithic substrate is selected from the group of GaAs and SiGe.

4. The absorptive tunable bandstop filter of claim 2, in which said planar monolithic substrate is mounted on a surface-mount package.

5. The absorptive tunable bandstop filter of claim 1, in which the at least a third all-pass filter includes a plurality of all-pass filters.

6. The absorptive tunable bandstop filter of claim 1, in which said input power divider includes a 3 dB coupling device.

7. The absorptive tunable bandstop filter of claim 6, in which said 3 dB coupling device includes a Wilkinson divider.

8. The absorptive tunable bandstop filter of claim 6, in which said 3 dB coupling device includes a quadrature hybrid.

9. The absorptive tunable bandstop filter of claim 6, in which said 3 dB coupling device includes a 180° hybrid.

10. The absorptive tunable bandstop filter of claim 6, in which said 3 dB coupling device includes a Lange coupler.

11. The absorptive tunable bandstop filter of claim 6, in which said 3 dB coupling device includes a directional coupler.

12. The absorptive tunable bandstop filter of claim 1, in which at least one of said first, second and third all-pass filters includes first and second series connected inductors, said first and second series connected inductors connected in parallel with first and second series connected electrically tunable variable capacitors;
 a shunt electrically tunable variable capacitor connected to the junction of said first and second series connected inductors, and
 a shunt bias network connected to the junction of said first and second series connected variable capacitors.

13. The absorptive tunable bandstop filter of claim 12, further including an input bias network which connects an electrical tuning voltage to said tunable variable capacitors through the respective voltage tuning ports.

14. The absorptive tunable bandstop filter of claim 13, in which said shunt bias network and said input bias network each respectively include a series connected bias resistance and bias inductor.

15. The absorptive tunable bandstop filter of claim 14, in which each of the shunt bias network and the input bias network are connected to ground.

16. The absorptive tunable bandstop filter of claim 12, in which said shunt bias network and said shunt variable capacitor are connected to ground.

17. The absorptive tunable bandstop filter of claim 12, in which each of said first, said second, and said shunt electrically tunable variable capacitors includes a respective varactor.

18. The absorptive tunable bandstop filter of claim 17, in which each of said varactors includes a respective diode.

19. The absorptive tunable bandstop filter of claim 17, in which at least one of said varactors respectively includes two diodes with like electrodes coupled together.

20. The absorptive tunable bandstop filter of claim 17, in which each of said varactors includes a respective pn junction.

21. The absorptive tunable bandstop filter of claim 17, in which each of said varactors includes a respective field effect transistor.

22. The absorptive tunable bandstop filter of claim 17, in which each of said electrically tunable variable capacitors includes a respective ferroelectric capacitor.

23. The absorptive tunable bandstop filter of claim 17, in which each of said electrically tunable variable capacitors includes a respective MEMS based capacitor.

24. The absorptive tunable bandstop filter of claim 1, in which the first fixed voltage is ground voltage.

* * * * *